United States Patent
Li et al.

(10) Patent No.: US 11,056,392 B2
(45) Date of Patent: Jul. 6, 2021

(54) FINFET DEVICES HAVING GATE STACKS WITH PROTRUDING PARTS AND METHOD OF FORMING THE SAME

(71) Applicant: Taiwan Semiconductor Manufacturing Co., Ltd., Hsinchu (TW)

(72) Inventors: Cheng-Chien Li, Hsinchu County (TW); Wei-Shuo Ho, New Taipei (TW); Huang-Chao Chang, Hsinchu (TW); Wei-Zhe Jhang, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/939,304

(22) Filed: Mar. 29, 2018

(65) Prior Publication Data

US 2019/0304842 A1  Oct. 3, 2019

(51) Int. Cl.
*H01L 29/66* (2006.01)
*H01L 21/8234* (2006.01)
*H01L 29/78* (2006.01)
*H01L 27/088* (2006.01)

(52) U.S. Cl.
CPC .. *H01L 21/823431* (2013.01); *H01L 27/0886* (2013.01); *H01L 29/6681* (2013.01); *H01L 29/66545* (2013.01); *H01L 29/7848* (2013.01); *H01L 29/7851* (2013.01)

(58) Field of Classification Search
CPC ......... H01L 29/66795; H01L 29/66545; H01L 29/785; H01L 21/823431; H01L 29/7851; H01L 21/76224; H01L 27/0886; H01L 29/6681; H01L 21/823468; H01L 21/823821; H01L 21/823842; H01L 21/845; H01L 27/0924; H01L 29/7848
USPC ........ 438/151, 283, 299, 424, 589; 257/288, 257/347, E21.415
See application file for complete search history.

(56) References Cited

U.S. PATENT DOCUMENTS

| | | | |
|---|---|---|---|
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 2003/0052088 A1* | 3/2003 | Khan | H01L 21/3065 216/67 |

(Continued)

*Primary Examiner* — David Chen
(74) *Attorney, Agent, or Firm* — JCIPRNET (57) ABSTRACT

A method for forming a FinFET device is described. The method includes the following steps. A substrate is patterned to form fins. Dummy gate stack is formed on the substrate and over the fins, wherein the dummy gate stack may be formed by the following steps: a dummy layer is formed; a first etching step is performed on the dummy layer with a bromine containing etching gas to form a dummy strip; a second etching step is performed on the dummy strip with a chlorine containing etching gas to form the dummy gate stack. The dummy gate stack is replaced with a gate stack.

20 Claims, 10 Drawing Sheets

(56) References Cited

U.S. PATENT DOCUMENTS

| | | | |
|---|---|---|---|
| 2014/0183599 A1* | 7/2014 | Hong | H01L 29/785 257/190 |
| 2015/0236123 A1* | 8/2015 | Chang | H01L 29/0847 257/347 |
| 2016/0027684 A1* | 1/2016 | Chang | H01L 21/76235 257/401 |
| 2016/0049483 A1* | 2/2016 | Zhang | H01L 29/66545 257/401 |
| 2016/0071980 A1* | 3/2016 | Chang | H01L 21/0223 257/410 |
| 2016/0099337 A1* | 4/2016 | Cheng | H01L 21/32135 438/585 |
| 2016/0111518 A1* | 4/2016 | Chang | H01L 29/6681 257/401 |
| 2016/0204264 A1* | 7/2016 | You | H01L 29/401 257/401 |
| 2017/0162674 A1* | 6/2017 | Kim | H01L 29/66795 |
| 2019/0027569 A1* | 1/2019 | Shen | H01L 21/32137 |

* cited by examiner

FINFET DEVICES HAVING GATE STACKS WITH PROTRUDING PARTS AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of manufacturing ICs and, for these advances to be realized, similar developments in IC manufacturing are needed. For example, a three-dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 1 to FIG. 11B are schematic views of a method of forming a FinFET device in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 to FIG. 11B are schematic views of a method of forming a FinFET device in accordance with some embodiments.

Figure 1:
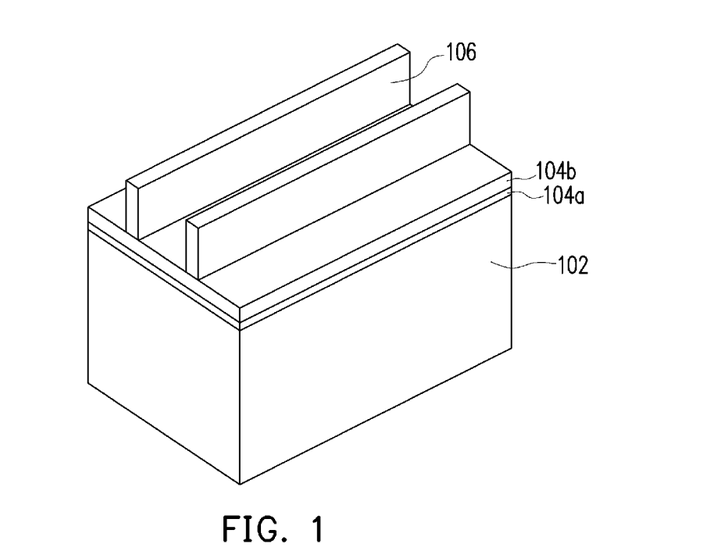

Referring to FIG. 1, a substrate 102 is provided. In one embodiment, the substrate 102 includes a silicon substrate, a silicon-on-insulator (SOI) substrate, a silicon germanium substrate, or a suitable semiconductor substrate. Other semiconductor materials including group III, group IV, and group V elements may also be used. The substrate 102 may comprise various doped regions depending on design requirements (e.g., p-type substrate or n-type substrate). In some embodiments, the doped regions may be doped with p-type and/or n-type dopants. For example, the doped regions may be doped with p-type dopants, such as boron or $BF_2$; n-type dopants, such as phosphorus or arsenic; and/or combinations thereof. The doped regions may be configured for an n-type FinFET, a p-type FinFET or the combination thereof. In some alternative embodiments, the substrate 102 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In the illustrated embodiment, a pad layer 104a and a mask layer 104b are sequentially formed on the substrate 102. The pad layer 104a may be a silicon oxide thin film formed, for example, by a thermal oxidation process. The pad layer 104a may act as an adhesion layer between the substrate 102 and mask layer 104b. The pad layer 104a may also act as an etch stop layer for etching the mask layer 104b. In some embodiments, the mask layer 104b is a silicon nitride layer formed by, for example, chemical vapor deposition (CVD), low-pressure chemical vapor deposition (LPCVD) or plasma enhanced chemical vapor deposition (PECVD). Subsequently, a patterned photoresist layer 106 having a predetermined pattern is formed on the mask layer 104b.

Figure 2:
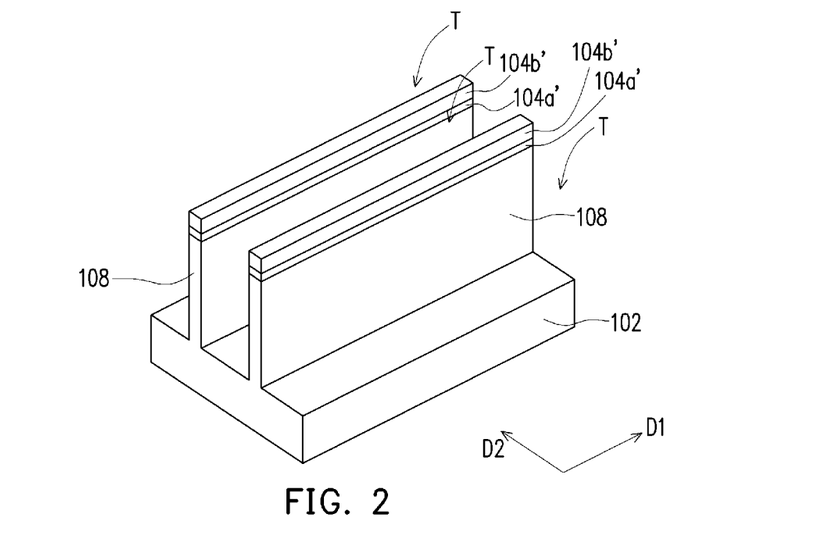

Referring to FIG. 2, after forming the patterned photoresist layer 106, portions of the mask layer 104b and the pad layer 104a which are not covered by the patterned photoresist layer 106 are sequentially etched to form a patterned mask layer 104b' and a patterned pad layer 104a' so as to expose the underlying substrate 102. By using the patterned mask layer 104b', the patterned pad layer 104a' and the patterned photoresist layer 106 as a mask, portions of the substrate 102 are exposed and etched to form trenches T and a plurality of fins 108. The fins 108 are parallel to one another and are extending along a first direction D1. Although only two fins 108 are illustrated, it should be noted that the number of fins 108 are not limited thereto, and more fins 108 may be formed in accordance with actual design requirements. After the substrate 102 is patterned, the fins 108 are covered by the patterned mask layer 104b' and the patterned pad layer 104a', whereas the patterned photoresist layer 106 is removed from a top surface of the patterned mask layer 104b'. Furthermore, two adjacent trenches T are spaced apart from each other by one of the fins 108. In one embodiment, an optional cleaning process may be performed to remove a native oxide of the substrate 102 and the fins 108. The cleaning process may be performed using diluted hydrofluoric (DHF) acid or other suitable cleaning solutions.

Figure 3:
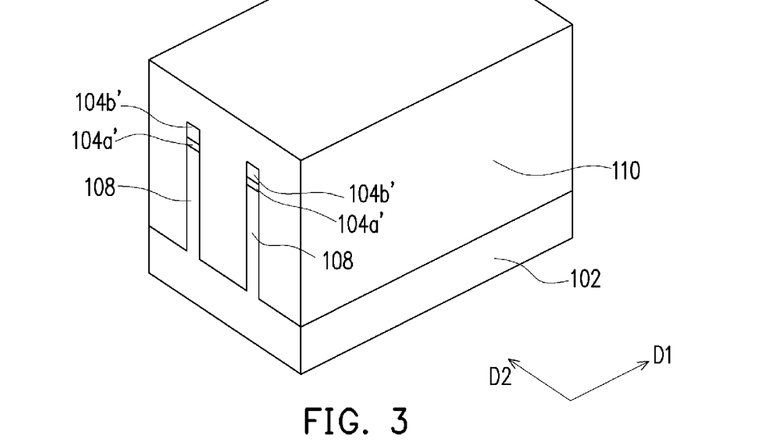

Referring to FIG. 3, an insulating material 110 is formed over the substrate 102 to cover the plurality of fins 108 and to fill up the trenches T. In addition, the insulating material 110 further covers the patterned pad layer 102a' and the patterned mask layer 104b'. In some embodiments, the insulating material 110 may include silicon oxide, silicon nitride, silicon oxynitride, a spin-on dielectric material, or a low-k dielectric material. The insulating material 110 is, for example, formed by high-density-plasma chemical vapor deposition (HDP-CVD), sub-atmospheric CVD (SACVD) or by spin-on processes.

Figure 4:
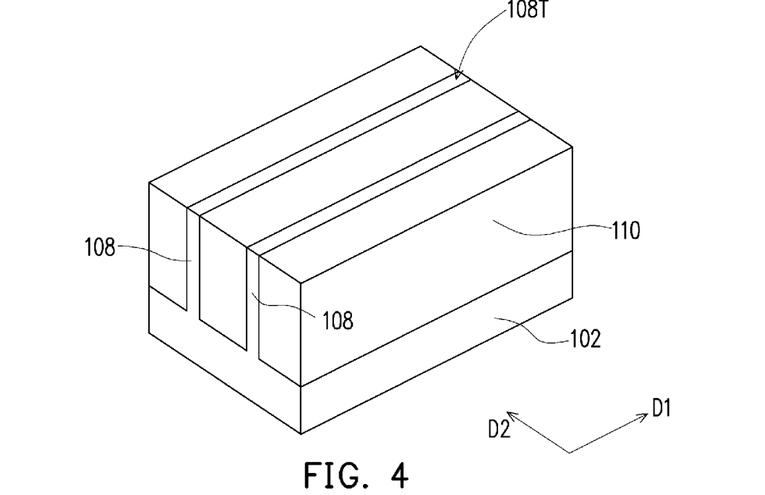

Referring to FIG. 4, in a subsequent step, a chemical mechanical polish (CMP) process is, for example, performed to remove a portion of the insulating material 110, the patterned mask layer 104b' and the patterned pad layer 104a' until top surfaces 108T of the plurality of fins 108 are exposed. As shown in FIG. 4, after the insulating material 110 is polished, a top surface of the remaining insulating material 110 is substantially coplanar with the top surfaces 108T of the plurality of fins 108.

Figure 5:
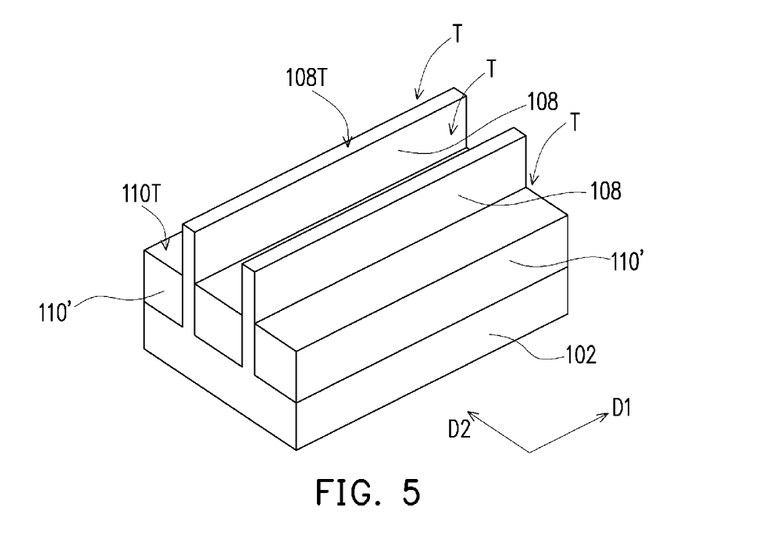

Referring to FIG. 5, the polished insulating material 110 filled in the trenches T is partially removed by an etching process, such that a plurality of insulators 110' are formed on the substrate 102. Each of the insulators 110' is located in one of the trenches T and separated by the plurality of fins 108. In one embodiment, the etching process may be a wet etching process with hydrofluoric acid (HF) or a dry etching process. After the etching process, the top surfaces 110T of the insulators 110' are lower than the top surface 108T of the plurality of fins 108. In other words, the plurality of fins 108 protrudes out form the top surfaces 110T of the insulators 110', and sidewalls of the plurality of fins 108 are exposed. In certain embodiments, the plurality of insulators 110' cover lower portions of the fins 108.

After the insulators 110' shown in FIG. 5 are formed, the steps to form a dummy gate stack on the insulators 110' and over the plurality of fins 108 will be described with references to FIG. 6 to FIG. 8C.

Figure 6:
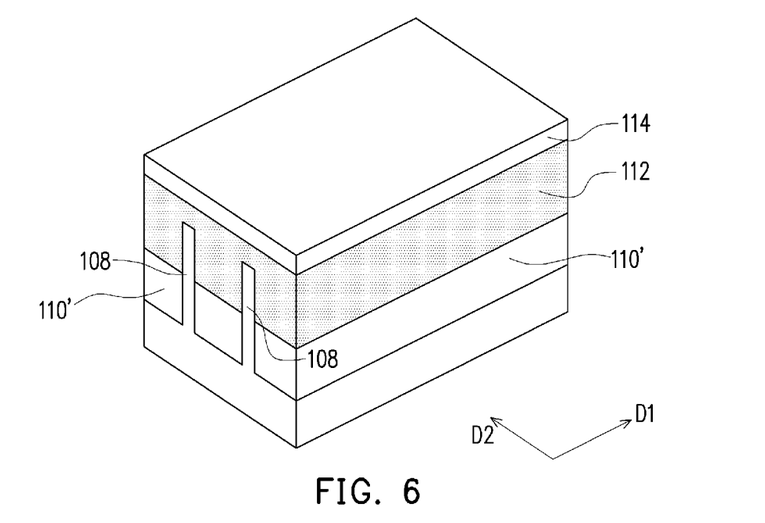

Referring to FIG. 6, a dummy layer 112 is formed on the insulators 110' and covering the plurality of fins 108. Subsequently, a hard mask layer 114 is formed over the dummy layer 112 covering the dummy layer 112. In some embodiments, the dummy layer 112 includes silicon-containing materials, such as poly-silicon, amorphous silicon or a combination thereof. In some embodiments, the hard mask layer 114 is a silicon nitride layer formed by, for example, chemical vapor deposition (CVD), low-pressure chemical vapor deposition (LPCVD) or plasma enhanced chemical vapor deposition (PECVD). Optionally, an oxide layer (not shown) is formed before forming the dummy layer 112 to protect the fins 108.

Figure 7A:
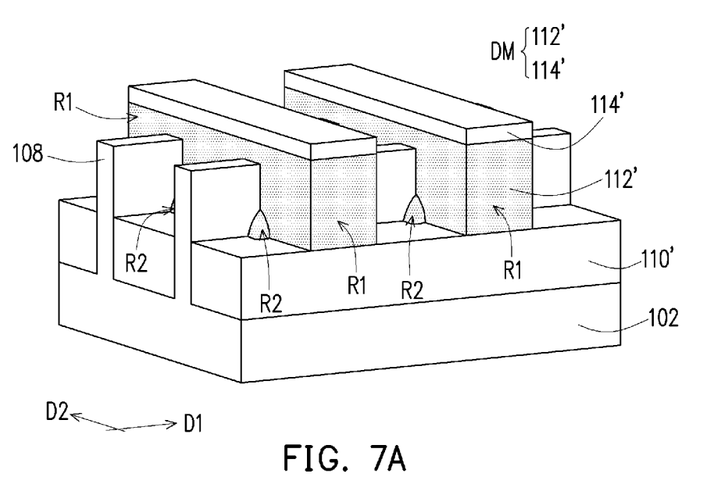

Referring to FIG. 7A, after forming the dummy layer 112 and the hard mask layer 114, a first etching step is performed using a first etching gas to form a plurality of dummy strips 112', and a plurality of hard mask strips 114' covering the plurality of dummy strips 112'. The number of the dummy strips 112' and hard mask strips 114' shown in FIG. 7A are for illustrative purposes but not intended to limit the structure of the present disclosure. The formed dummy strips 112' and hard mask strips 114' are extending along a second direction D2 different than the first direction D1. For example, the second direction D2 is perpendicular to the first direction D1, so that the dummy strips 112' are formed to intersect with the plurality of fins 108. In some embodiments, the first etching step is performed by using a bromine containing etching gas. In certain embodiments, hydrogen bromide (HBr) is used as the first etching gas. The first etching gas is for example, the main etching gas used in the first etching step, while other types of etching gas may be used in combination. In some embodiments, the first etching step is performed by using a source power of lower than 1000 Watts (1000 W).

Figure 7B:
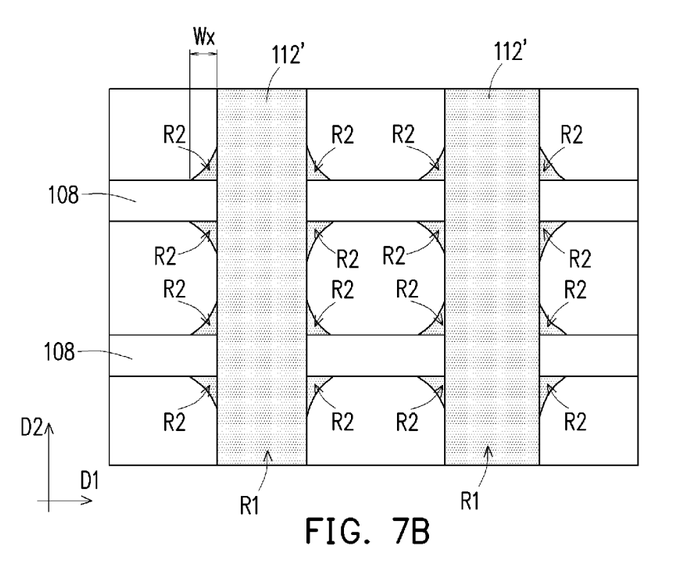

As shown in FIG. 7A, after the first etching step, each of the dummy strips 112' are formed with a first part R1 and a plurality of second parts R2 (protruding parts). To more clearly describe the features of the dummy strips 112', references are made to FIG. 7B and FIG. 7C, which are respectively a top-view (FIG. 7B) and a front-view (FIG. 7C) of the structure shown in FIG. 7A. In FIG. 7B, the hard mask strips 114' are omitted for better illustration of the underlying features. As illustrated in FIG. 7B, each of the dummy strips 112' have a first part R1 that are extending along a second direction D2 different than the first direction D1. In addition, each dummy strips 112' have a plurality of second parts R2 (or protruding parts) that protrudes out from the first part R1. The second parts R2 are located aside the fins 108, wherein the second parts R2 may have a maximum width of Wx. In some embodiments, the second parts R2 are located at intersections of the first part R1, the fins 108 and the insulators 110'. In certain embodiments, at least two of the second parts R2 are located at opposing sidewalls of each fin 108. Furthermore, as more clearly illustrated from the front-view shown in FIG. 7C, each of the dummy strips 112' have an upper portion X1 with a substantially vertical profile, and a lower portion X2 with separate protruding parts (second parts R2) with tapered profiles. The second parts R2 of the dummy strips 112' are for example, located in the lower portion X2, corresponding to the protruding parts with the tapered profile.

Figure 8A:
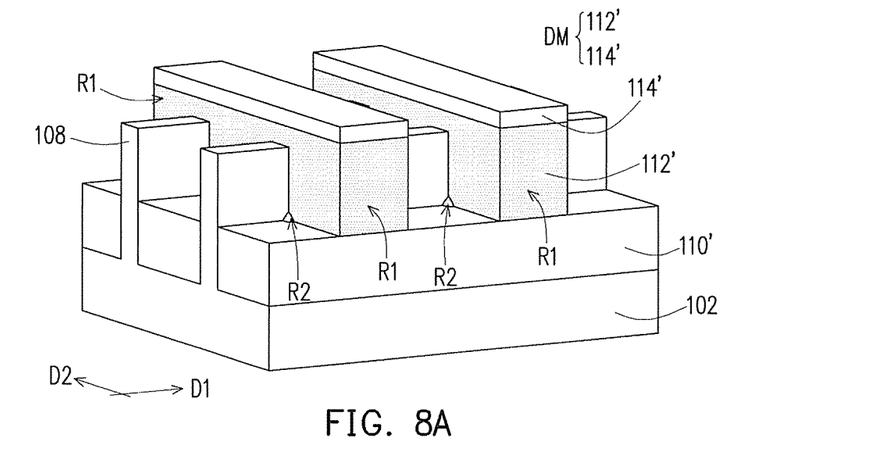

Referring to FIG. 8A, in a subsequent step, a second etching step is performed using a second etching gas to complete the formation of the dummy gate stack DM. In some embodiments, the second etching step is performed by using a chlorine containing etching gas. In certain embodiments, chlorine gas ($Cl_2$) is used as the second etching gas. The second etching gas is, for example, the main etching gas used in the second etching step, while other types of etching gas may be used in combination. The second etching gas is selected on the basis that the second etching gas has a smaller molecular weight of the ion as compared to the first etching gas (chloride versus. bromide). In some embodiments, the source power for performing the second etching step is greater than a source power for performing the first etching step to achieve better etching efficiency. In some embodiments, the source power of the second etching step is in the range of 1000 W to 1500 W. In certain embodiments, the source power of the second etching step is in the range of 1100 W to 1400 W.

Figure 7C:
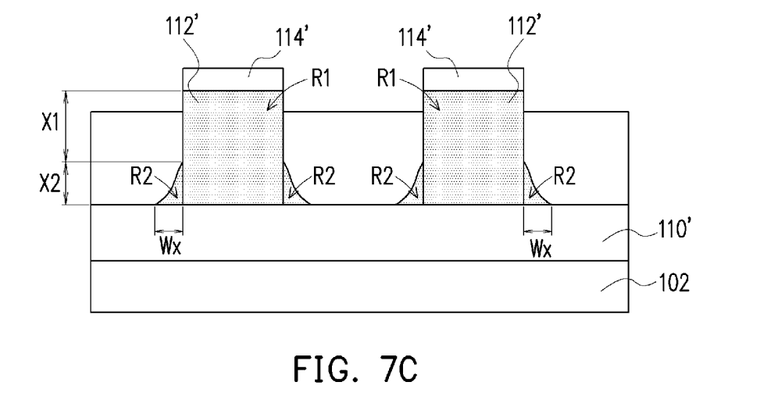
Figure 8B:
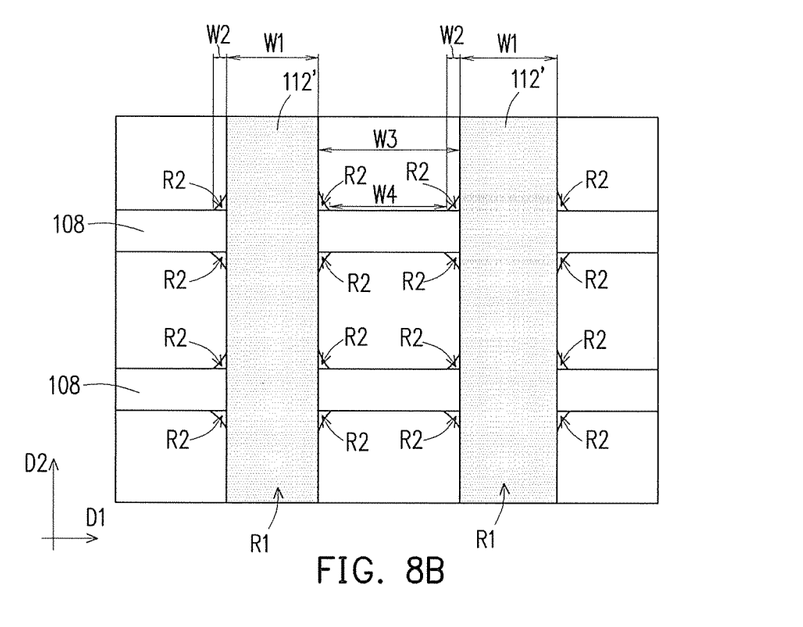
Figure 8C:
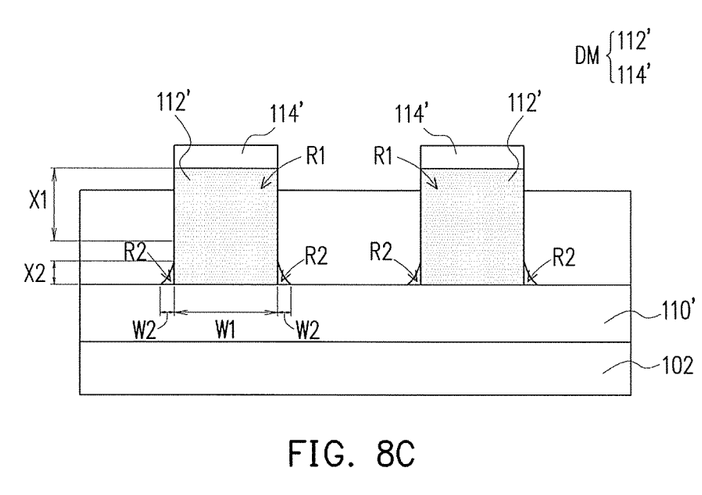

After the second etching step, the completed dummy gate stack DM contains a dummy strip 112' and a hard mask layer 114' formed thereon. To more clearly describe the features of the dummy gate stack DM, references are also made to FIG. 8B and FIG. 8C, which are respectively a top-view (FIG. 8B) and a front-view (FIG. 8C) of the structure shown in FIG. 8A. As shown in FIGS. 8A to 8C, the second etching step trims a profile of the lower portion X2 of the dummy strip 112'. For example, the second etching step is performed to reduce a width of the protruding parts (second parts R2) with the tapered profile. The second part R2 in the lower portion X2 of the dummy strip 112' has the width Wx as shown in FIGS. 7B and 7C, wherein the width Wx of the second part R2 is reduced to have a maximum width of W2 as shown in FIGS. 8B and 8C. That is, width W2 is smaller than width Wx.

Similar to the structure shown in FIGS. 7A to 7C, each of the etched dummy strips 112' shown in FIGS. 8A to 8C also have a first part R1 and a plurality of second part R2 (protruding parts), wherein the first part R1 is extending along a second direction D2 and the plurality of second parts R2 protrudes out from the first part R1. The difference being that the maximum width of the second parts R2 is reduced. As more clearly illustrated in FIGS. 8B and 8C, after the etching step, a width of the first part R1 of the dummy strips 112' is W1, and a maximum width of the second part is W2, wherein W2/W1 is approximately 0.02 to 0.1. In certain embodiments, W2/W1 is approximately 0.045 to 0.09. Furthermore, as shown in FIG. 8B, a distance between the first parts R1 of the adjacent dummy strips 112' is W3, and a distance between the second parts R2 of the adjacent dummy strips 112' is W4, wherein W4/W3 is approximately 0.88 to 0.97.

Figure 9A:
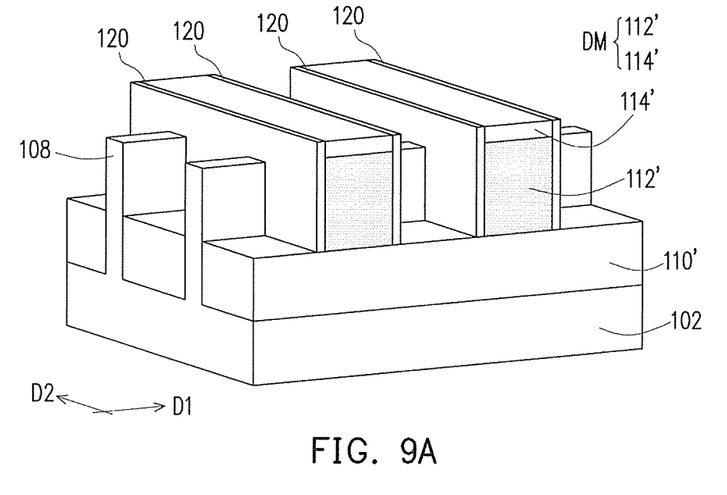

Referring to FIG. 9A, after forming the dummy gate stack DM, spacers 120 are formed on two sidewalls of the dummy gate stack DM. That is, the spacers 120 are formed on the two sidewalls of the dummy strip 112' and on two sidewalls of the hard mask strip 114'. The spacers 120 are formed on the insulators 110' and over the fins 108, and extend along the sidewalls of the dummy strip 112'. In some embodiments, the spacers 120 are formed of dielectric materials, such as silicon nitride, SiCON or the combination thereof. The spacers 120 may be a single layer or a multilayered structure. In some embodiments, the spacers 120 are formed by depositing a blanket layer of a dielectric material and performing an anisotropic etching process to form the spacers 120 on both sides of the dummy strip 112'.

Figure 9B:
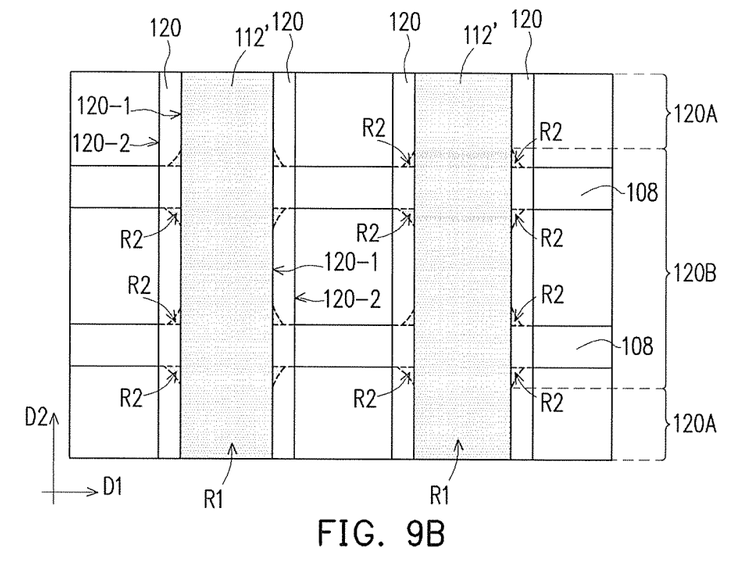

Referring to FIG. 9B, from a top-view of the structure shown in FIG. 9A, the spacers 120 are formed to cover the first part R1 and the second part R2 of the dummy strip 112'. In the exemplary embodiment, the formed spacers 120 have a straight portion 120A and a curved portion 120B, wherein the straight portion 120A is in contact with the first part R1 of the dummy strip 112', and the curved portion 120B is in contact with the second parts R2 of the dummy strip 112'. In other words, a profile of an inner side of the spacers 120 may correspond with a profile of the dummy strip 112' having the first part R1 and the second parts R2. In certain embodiments, each of the spacers 120 have a first sidewall 120-1 with a vertical profile, and a second sidewall 120-2 with an irregular profile. Furthermore, the first sidewall 120-1 may be opposite to the second sidewall 120-2, wherein the second sidewall 120-2 with the irregular profile is facing the dummy strip 112' and the first sidewall 120-1 with the vertical profile is facing away from the dummy strip 112'.

Figure 10:
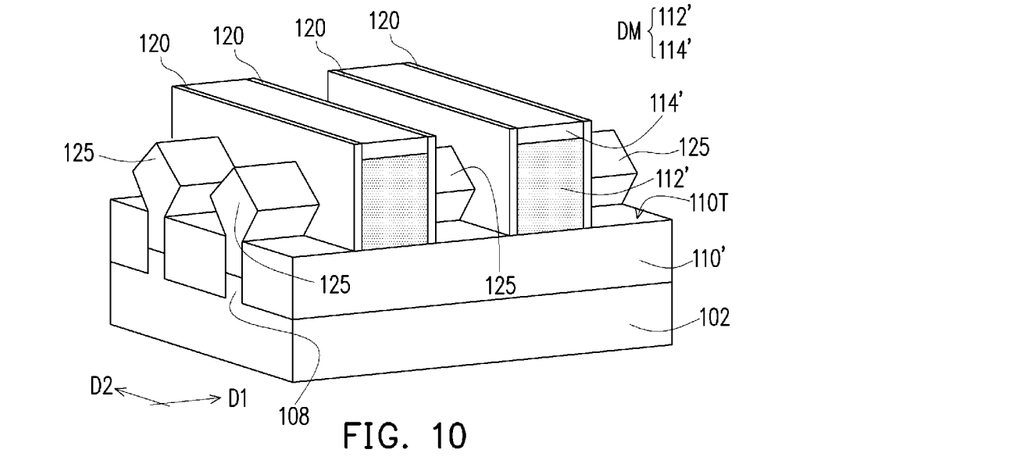

Referring to FIG. 10, after forming the spacers 120, exposed portions (shown in FIG. 9A) of the fins 108 are recessed, for example, by using anisotropic etching, isotropic etching or the combination thereof. On the other hand, the portions of the fins 108 that are covered by the dummy gate stack DM are not removed while the exposed portions of the fins 108 are recessed. In some embodiments, the fins 108 are recessed below the top surface 110T of the insulators 110'. In certain embodiments, the exposed portions of the fins 108 are not entirely removed. After the exposed portions of the fins 108 are recessed, strained material portions 125 are filled within the recess and in between the insulators 110'. The strained material portions 125 are located on opposite sides of the dummy gate stack DM. In some embodiments, the strained material portions 125 comprise SiGe, silicon carbon (SiC) or SiP, for example. In certain embodiments, the strained material portions 125, such as SiGe, is epitaxial-grown with a p-type dopant for straining a p-type FinFET. That is, the strained material portions 125 are doped with the p-type dopant to be the source and the drain of the p-type FinFET. The p-type dopant comprises boron or $BF_2$, and the strained material portions 125 may be epitaxial-grown by LPCVD process with in-situ doping. In another embodiment, the strained material portions 125, such as SiC, SiP, a combination of SiC/SiP, or SiCP is epitaxial-grown with an n-type dopant for straining an n-type FinFET. That is, the strained material portions 125 are doped with the n-type dopant to be the source and the drain of the n-type FinFET. The n-type dopant comprises arsenic and/or phosphorus, and the strained material portions 125 may be epitaxial-grown by LPCVD process with in-situ doping. The strained material portions 125 may be a single layer or a multi-layer.

The method of forming the strained material portions 125 are, for example, performed by first filling the recess with strained materials. After the recesses are filled with the strained material, further epitaxial growth of the strained material causes the strained material portions 125 to expand upward and horizontally beyond the recesses and above the insulators 110'. Since the lattice constant of the strained material is different from the material of the substrate 102, the channel region is strained or stressed to increase carrier mobility of the device and enhance the device performance. The strained material portions 125 are implanted to form source and drain regions (labelled as 125 as well). The source and drain regions 125, also called strained source and drain regions, are located on opposite sides of the dummy gate stack DM. In some embodiments, the source and drain regions 125 are optionally formed with silicide top layers (not shown) by silicidation.

Figure 11A:
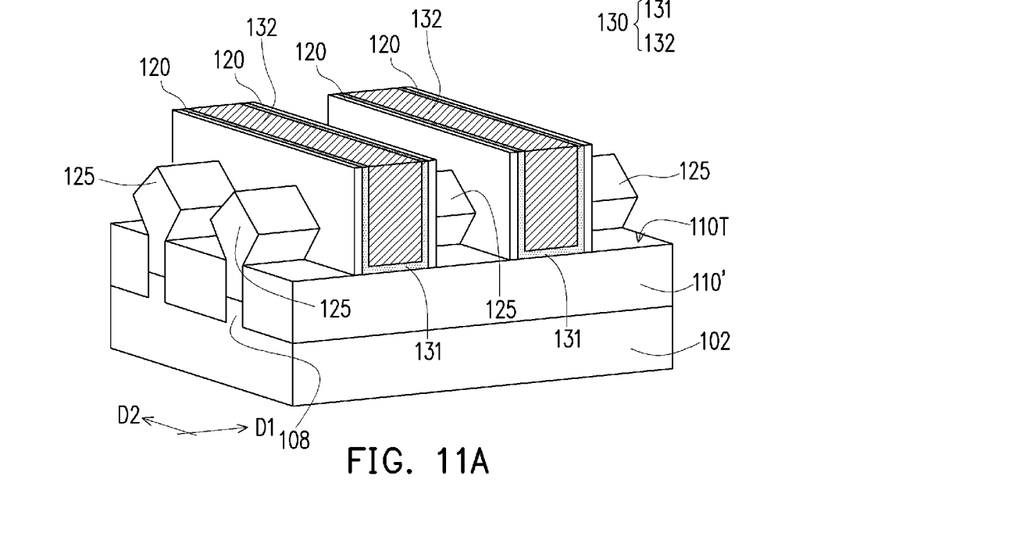

Referring to FIG. 11A, after forming the strained material portions 125, the dummy gate stack DM is removed and replaced with a gate stack 130. In the exemplary embodiment, the gate stack 130 comprises a gate dielectric layer 131 and a gate electrode layer 132. The gate dielectric layer 131 is formed on the insulators 110' and over the fins 108, whereas the gate electrode layer 132 is formed over the gate dielectric layer 131. In some embodiments, a material of the gate dielectric layer 131 includes silicon oxide, silicon nitride, silicon oxy-nitride, high-K dielectric materials, or a combination thereof. High-K dielectric materials include metal oxides such as oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. Furthermore, the gate dielectric layer 131 is formed using a suitable process such as atomic layer deposition (ALD), chemical vapor deposition (CVD), physical vapor deposition (PVD), flowable chemical vapor deposition (FCVD), thermal oxidation, UV-ozone oxidation, or a combination thereof. The gate dielectric layer 131 may further comprise an interfacial layer (not shown). For example, the interfacial layer may be used in order to create a good interface between the fins 108 and the gate electrode layer 132, as well as to suppress the mobility degradation of the channel carrier of the semiconductor device. Moreover, the interfacial layer is formed by a thermal oxidation process, a chemical vapor deposition (CVD) process, or an atomic layer deposition (ALD) process. A material of the interfacial layer includes a dielectric material, such as a silicon oxide layer or a silicon oxynitride layer.

In some embodiments, a material of the gate electrode layer 132 includes metal, metal alloy, or metal nitride. For example, in some embodiments, the gate electrode layer 132 may include TiN, WN, TaN, Ru, Ti, Ag, Al, TiAl, TiAlN, TaC, TaCN, TaSiN, Mn, or Zr. Moreover, the gate electrode layer 132 may further include a barrier, a work function layer, or a combination thereof. As mentioned above, an interfacial layer may be included between the gate electrode layer 132 and the fins 108, but it construes no limitation to the present disclosure. In some alternative embodiments, a liner layer, a seed layer, an adhesion layer, or a combination thereof may also be included between the gate electrode layer 132 and the fins 108. Since the dummy gate stack DM is being replaced by the gate stack 130, subsequent process of forming metallic interconnection (not illustrated) can be implemented. For instance, other conductive lines (not illustrate) are formed to electrically connect the gate electrode layer 132 with other elements in the semiconductor device.

Figure 11B:
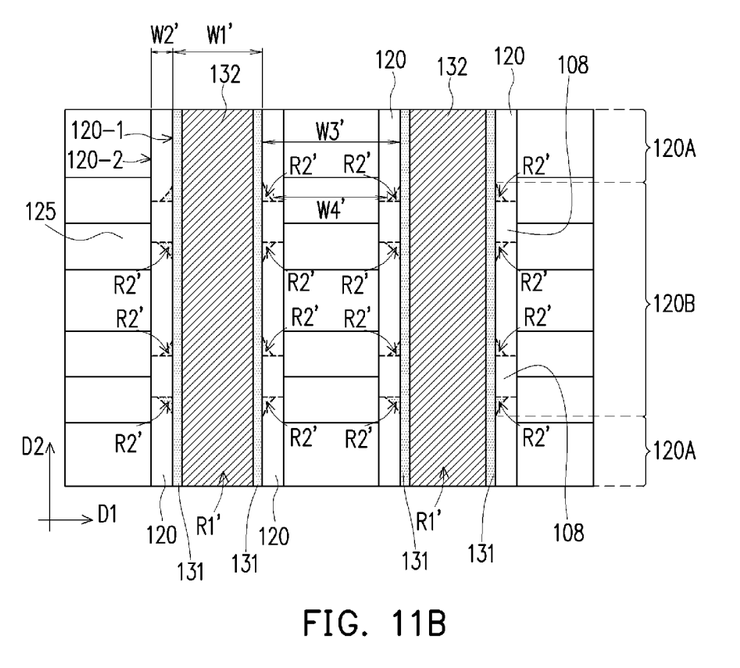

Furthermore, since the dummy gate stack DM is being replaced by the gate stack 130, the outline/structure of the gate stack 130 will be substantially the same with that of the dummy gate stack DM. For instance, referring to FIG. 11B, which is a top-view of the structure shown in FIG. 11A, each of the gate stacks 130 may include a first part R1', and a plurality of second parts R2'. The first part R1' is extending along a second direction D2 different than the first direction D1, or the second direction D2 is perpendicular to the first direction D1. In addition, the plurality of second parts R2' protrude out from the first part R1', and two of the second parts R2' are located at two opposing sides of the fins 108, wherein a width of the first part R1' is W1', a maximum width of the second part R2' is W2', and W2'/W1' is approximately 0.02 to 0.1. In certain embodiments, W2'/W1' is approximately 0.045 to 0.09. Moreover, as shown in FIG. 11B, a distance between the first parts R1' of the adjacent gate stacks 130 is W3', and a distance between the second parts R2' of the adjacent gate stacks 130 is W4', wherein W4'/W3' is approximately 0.88 to 0.97. Similarly, each of the gate stack 130 may be treated as having an upper portion (corresponding to X1 in FIG. 8C) with a substantially vertical profile, and a lower portion (corresponding to X2 in FIG. 8C) with separate protruding parts (second parts R2') with tapered profile, whereas the second parts R2' of the gate stack 130 are for example, located in the lower portion (corresponding to X2 in FIG. 8C) and corresponds to the protruding parts with the tapered profile.

In the above-mentioned embodiments, the dummy gate stack is formed by performing a first etching step using a bromine containing first etching gas and a second etching step using a chlorine containing etching gas. As such, when the dummy gate stack is replaced with the gate stack, the gate stack having first part and a plurality of second parts can be formed. By having a gate stack with such profile, parasitic capacitance of the device can be reduced, and the yield and device performance can be improved.

In accordance with some embodiments of the disclosure, a FinFET device comprising a substrate and a plurality of gate stacks is provided. The substrate has fins extending along a first direction. The plurality of gate stacks is disposed over the fins, wherein each of the gate stacks have a first part and a plurality of second parts, the first part extends along a second direction different than the first direction, the plurality of second parts protrude out from the first part, and the second parts are located aside the fins, wherein a width of the first part is W1, a maximum width of the second part is W2, and W2/W1 is approximately 0.02 to 0.1.

In accordance with another embodiment of the disclosure, a method for forming a FinFET device is described. The method includes the following steps. A substrate is patterned to form fins. Dummy gate stack is formed on the substrate and over the fins, wherein the dummy gate stack may be formed by the following steps: a dummy layer is formed; a first etching step is performed on the dummy layer with a bromine containing etching gas to form a dummy strip; a second etching step is performed on the dummy strip with a chlorine containing etching gas to form the dummy gate stack. The dummy gate stack is replaced with a gate stack.

In accordance with yet another embodiment of the disclosure, a method for forming a FinFET device is described. The method includes the following steps. A substrate is patterned to form fins extending along a first direction. A dummy gate stack is formed on the substrate and over the fins, wherein the dummy gate stack is formed by the following steps: a dummy layer is formed; a first etching step of the dummy layer is performed to form a dummy strip, wherein the dummy strip has an upper portion with a substantially vertical profile, and a lower portion with separate protruding parts with tapered profiles; a second etching step of the dummy strip is performed to reduce a width of the protruded parts of the lower portion of the dummy strip. The dummy gate stack is replaced with a gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a FinFET device, comprising:
   patterning a substrate to form fins;
   forming a dummy gate stack on the substrate and over the fins, wherein forming the dummy gate stack comprises:
      forming a dummy layer covering the fins;
      forming a hard mask layer over the dummy layer;
      performing a first etching step to remove portions of the dummy layer and portions of the hard mask layer with a bromine containing etching gas as a main etching gas in the first etching step to form a dummy strip and a hard mask strip, wherein after the first etching step, the dummy strip is formed with a first part located over the fins, and a plurality of tapered second parts in physical contact with sidewalls of the first part and sidewalls of the fins, and the hard mask strip overlaps with the first part of the dummy strip and does not overlap with the plurality of tapered second parts of the dummy strip, and the first etching step reveals portions of the fins; and
      performing a second etching step to remove portions of the plurality of tapered second parts of the dummy strip from the sidewalls of the first part and from the sidewalls of the fins with a chlorine containing etching gas to form the dummy gate stack, wherein the chlorine containing etching gas is selected as a main etching gas in the second etching step on the basis that it has a smaller molecular weight of ion as compared to the bromine containing etching gas;

forming a blanket layer over the dummy gate stack, and performing an etching of the blanket layer to form spacers located on both sides of the dummy gate stack; and replacing the dummy gate stack with a gate stack.

2. The method for forming the FinFET device according to claim 1, wherein the bromine containing etching gas in the first etching step comprises HBr.

3. The method for forming the FinFET device according to claim 1, wherein the chlorine containing etching gas in the second etching step comprises $Cl_2$.

4. The method for forming the FinFET device according to claim 1, wherein a source power for performing the second etching step is greater than a source power for performing the first etching step.

5. The method for forming the FinFET device according to claim 4, wherein the source power of the second etching step is in the range of 1000 W to 1500 W.

6. The method for forming the FinFET device according to claim 4, wherein the source power of the second etching step is in the range of 1100 W to 1400 W.

7. The method for forming the FinFET device according to claim 1, wherein the second etching step trims a profile of the plurality of tapered second parts located at a lower portion of the dummy strip.

8. A method for forming a FinFET device, comprising:
patterning a substrate to form fins extending along a first direction;
forming a dummy gate stack on the substrate and over the fins, wherein forming the dummy gate stack comprises:
forming a dummy layer having a planar top surface;
performing an etching step on the dummy layer to form a dummy strip, wherein the etching step only consisting of a first etching step and a second etching step, wherein
the first etching step is performed on the planar top surface of the dummy layer using a first etching gas to form the dummy strip, wherein the dummy strip has an upper portion with a substantially vertical profile, and a lower portion with separate protruding parts with tapered profiles, and wherein four of the protruding parts are located at corners where the dummy strip intersects with each of the fins; and
the second etching step of the dummy strip is performed to reduce a height and a width of the four of the protruding parts located at the corners where the dummy strip intersects with each of the fins, wherein the second etching step is performed using a second etching gas with a smaller molecular weight of ion as compared to the first etching gas; and
replacing the upper portion and the lower portion with the separate protruding parts of the dummy gate stack with a gate stack.

9. The method for forming the FinFET device according to claim 8, wherein the gate stack is formed with a first part and a plurality of second parts, the first part extends along a second direction different than the first direction, the plurality of second parts protrude out from the first part, and the plurality of second parts is located aside the fins, wherein a width of the first part is W1, a maximum width of the plurality of second parts is W2, and W2/W1 is approximately 0.02 to 0.1.

10. The method for forming the FinFET device according to claim 9, further comprising:
forming a plurality of the gate stacks to replace a plurality of the dummy gate stacks, wherein a distance between the first parts of adjacent gate stacks is W3, and a minimum distance between the second parts of adjacent gate stacks is W4, and W4/W3 is approximately 0.88 to 0.97.

11. The method for forming the FinFET device according to claim 8, wherein a source power for performing the second etching step is greater than a source power for performing the first etching step.

12. The method for forming the FinFET device according to claim 11, wherein the source power of the second etching step is in the range of 1000 W to 1500 W.

13. The method for forming the FinFET device according to claim 8, wherein the first etching step is performed using HBr.

14. The method for forming the FinFET device according to claim 8, wherein the second etching step is performed using $Cl_2$.

15. A method for forming a FinFET device, comprising:
patterning a substrate to form fins extending along a first direction;
forming dummy gate stacks on the substrate and over the fins along a second direction perpendicular to the first direction, wherein forming the dummy gate stacks comprises:
forming a dummy layer;
performing a first etching step of the dummy layer using a first etching gas to form a first dummy strip and a second dummy strip physically separated from one another, wherein the first dummy strip has a first part that extends along the second direction, and a plurality of tapered second parts located at corners where the first part intersects with the fins, wherein the plurality of tapered second parts is located below a top surface of the fins, the second dummy strip has a third part that extends in parallel with the first part along the second direction, and a plurality of tapered fourth parts located at corners where the third part intersects with the fins, wherein the plurality of tapered fourth parts is located below another top surface of the fins, and the plurality of tapered second parts is facing the plurality of tapered fourth parts and spaced apart from the plurality of tapered fourth parts by a first distance; and
performing a second etching step to reduce a dimension of the plurality of tapered second parts of the first dummy strip, and to reduce a dimension of the plurality of tapered fourth parts of the second dummy strip so that the first distance between the plurality of tapered second parts and the plurality of tapered fourth parts is increased, and wherein the second etching step is performed using a second etching gas with a smaller molecular weight of ion as compared to the first etching gas; and
replacing the dummy gate stacks with gate stacks.

16. The method for forming the FinFET device according to claim 15, wherein the first etching step is performed using HBr.

17. The method for forming the FinFET device according to claim 15, wherein the second etching step is performed using $Cl_2$.

18. The method for forming the FinFET device according to claim 15, further comprises forming a blanket layer over the dummy gate stacks, and performing an etching of the blanket layer to form spacers located on both sides of each of the dummy gate stacks.

19. The method for forming the FinFET device according to claim 15, wherein the second etching step is performed to reduce a maximum width of the plurality of tapered second parts of the first dummy strip, and to reduce a maximum width of the plurality of tapered fourth parts of the second dummy strip.

20. The method for forming the FinFET device according to claim 15, wherein a source power for performing the second etching step is greater than a source power for performing the first etching step.

* * * * *